US011018073B2

(12) United States Patent
Lin et al.

(10) Patent No.: US 11,018,073 B2
(45) Date of Patent: May 25, 2021

(54) HEAT SPREADING DEVICE AND METHOD

(71) Applicant: Taiwan Semiconductor Manufacturing Company, Ltd., Hsinchu (TW)

(72) Inventors: Tsung-Shu Lin, New Taipei (TW); Wensen Hung, Zhubei (TW); Hung-Chi Li, Taipei (TW); Tsung-Yu Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/594,734

(22) Filed: Oct. 7, 2019

(65) Prior Publication Data

US 2020/0051888 A1    Feb. 13, 2020

Related U.S. Application Data

(62) Division of application No. 15/864,896, filed on Jan. 8, 2018, now Pat. No. 10,461,014.

(Continued)

(51) Int. Cl.
*H01L 21/78* (2006.01)
*H01L 23/367* (2006.01)
(Continued)

(52) U.S. Cl.
CPC ...... *H01L 23/3677* (2013.01); *H01L 21/4853* (2013.01); *H01L 21/4882* (2013.01);
(Continued)

(58) Field of Classification Search
CPC .............. H01L 23/3135; H01L 23/367; H01L 23/3675; H01L 25/0652; H01L 25/50;
(Continued)

(56) References Cited

U.S. PATENT DOCUMENTS 8,367,034 B2    2/2013    O'Brien et al.
8,802,504 B1    8/2014    Hou et al.
(Continued)

FOREIGN PATENT DOCUMENTS

CN    102782841 A    11/2012
CN    102956589 A    3/2013
(Continued)

OTHER PUBLICATIONS

Yan, Zhong, "Thermal Properties of Graphene and Applications for Thermal Management of High-Power Density Electronics," University of California Riverside Electronic Theses and Dissertations, https://escholarship.org/uc/item/8m67d089, Dec. 2013, 96 pages.

*Primary Examiner* — Fernando L Toledo
*Assistant Examiner* — Valerie N Newton
(74) *Attorney, Agent, or Firm* — Slater Matsil, LLP

(57) ABSTRACT

In an embodiment, a device includes: a die stack over and electrically connected to an interposer, the die stack including a topmost integrated circuit die including: a substrate having a front side and a back side opposite the front side, the front side of the substrate including an active surface; a dummy through substrate via (TSV) extending from the back side of the substrate at least partially into the substrate, the dummy TSV electrically isolated from the active surface; a thermal interface material over the topmost integrated circuit die; and a dummy connector in the thermal interface material, the thermal interface material surrounding the dummy connector, the dummy connector electrically isolated from the active surface of the topmost integrated circuit die.

20 Claims, 17 Drawing Sheets

Related U.S. Application Data

(60) Provisional application No. 62/552,902, filed on Aug. 31, 2017.

(51) Int. Cl.
*H01L 25/065* (2006.01)
*H01L 25/00* (2006.01)
*H01L 21/48* (2006.01)
*H01L 21/56* (2006.01)
*H01L 23/31* (2006.01)
*H01L 23/498* (2006.01)

(52) U.S. Cl.
CPC .......... *H01L 21/561* (2013.01); *H01L 21/565* (2013.01); *H01L 21/78* (2013.01); *H01L 23/3135* (2013.01); *H01L 23/367* (2013.01); *H01L 23/3675* (2013.01); *H01L 25/0652* (2013.01); *H01L 25/50* (2013.01); *H01L 23/3128* (2013.01); *H01L 23/49827* (2013.01); *H01L 2224/16225* (2013.01); *H01L 2224/32225* (2013.01); *H01L 2224/73204* (2013.01); *H01L 2224/92125* (2013.01); *H01L 2224/97* (2013.01); *H01L 2225/06517* (2013.01); *H01L 2225/06544* (2013.01); *H01L 2225/06558* (2013.01); *H01L 2225/06582* (2013.01); *H01L 2225/06589* (2013.01); *H01L 2924/10155* (2013.01); *H01L 2924/10158* (2013.01); *H01L 2924/15311* (2013.01); *H01L 2924/181* (2013.01)

(58) Field of Classification Search
CPC ........... H01L 23/3128; H01L 23/49827; H01L 2224/16225; H01L 2224/32225; H01L 2224/73204; H01L 2224/92125; H01L 2224/97; H01L 2225/06517; H01L 2225/06544; H01L 2225/06558; H01L 2225/06582; H01L 2225/06589; H01L 2924/10155; H01L 2924/10158; H01L 2924/15311; H01L 2924/181
See application file for complete search history.

(56) References Cited

U.S. PATENT DOCUMENTS

| | | | |
|---|---|---|---|
| 8,803,292 B2 | 8/2014 | Chen et al. | |
| 8,803,316 B2 | 8/2014 | Lin et al. | |
| 8,963,317 B2 * | 2/2015 | Lin | H01L 23/3677 |
| | | | 257/698 |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,496,189 B2 | 3/2016 | Yu et al. | |
| 9,368,479 B2 | 6/2016 | Katkar et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 10,199,356 B2 * | 2/2019 | Kinsley | H01L 23/36 |
| 2002/0084524 A1 | 7/2002 | Roh et al. | |
| 2005/0135066 A1 * | 6/2005 | Lee | H01L 23/36 |
| | | | 361/704 |
| 2011/0215457 A1 | 9/2011 | Park | |
| 2013/0155636 A1 * | 6/2013 | Park | H01L 23/5384 |
| | | | 361/772 |
| 2014/0300004 A1 | 10/2014 | Choi et al. | |
| 2015/0255429 A1 | 9/2015 | Katkar et al. | |
| 2016/0086869 A1 | 3/2016 | Ahn et al. | |
| 2016/0093598 A1 | 3/2016 | Jo et al. | |
| 2018/0374776 A1 * | 12/2018 | Liu | H01L 24/30 |

FOREIGN PATENT DOCUMENTS

| | | | | |
|---|---|---|---|---|
| CN | 105590906 A | 5/2016 | | |
| EP | 2560201 A2 | 2/2013 | | |
| KR | 20020057349 A | 7/2002 | | |
| KR | 20120077875 A | 7/2012 | | |
| WO | WO-2017123188 A1 * | 7/2017 | ......... | H01L 23/3675 |

* cited by examiner

HEAT SPREADING DEVICE AND METHOD

PRIORITY CLAIM AND CROSS-REFERENCE

This application is a division of U.S. patent application Ser. No. 15/864,896, filed on Jan. 8, 2018, and entitled "Heat Spreading Device and Method," which claims the benefit of U.S. Provisional Patent Application No. 62/552,902, filed on Aug. 31, 2017, and entitled "Heat Spreading Device and Method," which applications are incorporated herein by reference.

BACKGROUND

In the packaging of integrated circuits, semiconductor dies may be stacked through bonding, and may be bonded to other package components such as interposers and package substrates. The resulting packages are known as Three-Dimensional Integrated Circuits (3DICs). Heat dissipation is a challenge in the 3DICs.

A bottleneck may exist in efficiently dissipating the heat generated in the inner dies of the 3DICs. In a typical 3DIC, the heat generated in inner dies may have to be dissipated to outer components before the heat can be conducted to a heat spreader. Between the stacked dies and outer components, however, there exist other materials such as underfill, molding compound, and the like, which are not effective in conducting heat. As a result, the heat may be trapped in an inner region of a bottom stacked die and cause a sharp local temperature peak (sometimes referred to as a hot spot). Furthermore, hot spots due to heat generated by high-power consuming dies may cause thermal crosstalk problems for surrounding dies, negatively affecting the surrounding dies' performance and the reliability of the whole 3DIC package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
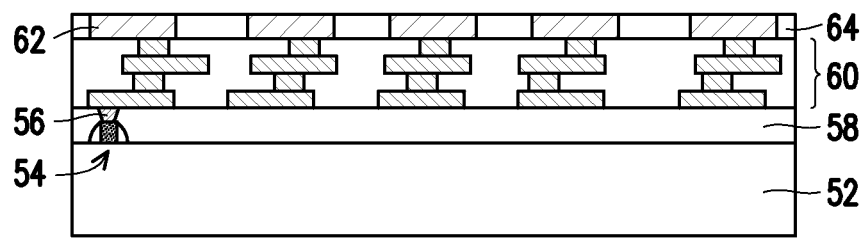
FIG. 1 is a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a die stack is formed on an interposer and dummy vias are optionally formed in the die stack. A thermal interface material is formed over the die stack and dummy connectors are formed in the thermal interface material. A heat spreader is attached to the die stack with the thermal interface material. Forming the dummy vias and/or dummy connectors may reduce the thermal resistance along a thermal path between the interposer and heat spreader, thereby reducing operating temperatures of the resulting device.

FIG. 1 is a cross-sectional view of an integrated circuit die 50, in accordance with some embodiments. The integrated circuit die 50 may be an interposer, logic device, or the like. The integrated circuit die 50 includes a substrate 52, devices 54, conductive plugs 56, inter-layer dielectrics (ILDs) 58, an interconnect 60, die connectors 62, and a dielectric material 64. The integrated circuit die 50 may be formed in a wafer (not shown), which may include different device regions that are singulated in subsequent steps to form a plurality of integrated circuit dies 50.

The substrate 52 has a front surface (e.g., the surface facing upwards in FIG. 1), sometimes called an active side, and a back surface (e.g., the surface facing downwards in FIG. 1), sometimes called an inactive side. The substrate 52 may be a semiconductor, such as silicon, doped or undoped, or an active layer of a semiconductor-on-insulator (SOI) substrate. The substrate 52 may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

The devices 54 may be formed in and/or on the front surface of the substrate 52. The devices 54 may be transistors, diodes, capacitors, resistors, etc. In embodiments where the integrated circuit dies 50 are logic dies, the devices 54 include active devices. In embodiments where the integrated circuit dies 50 are interposers, the devices 54 may be passive devices or may be omitted, such that the integrated circuit dies 50 are free of active devices. The conductive plugs 56 are electrically and physically coupled to the devices 54. The ILDs 58 surround the devices 54 and the conductive plugs 56, and comprise one or more dielectric layers.

The interconnect 60 interconnects the devices 54 to form an integrated circuit. The interconnect 60 may be formed by, for example, metallization patterns in dielectric layers on the front surface of the substrate 52. The metallization patterns include metal lines and vias formed in one or more dielectric layers. The metallization patterns of the interconnect 60 are electrically coupled to the devices 54 by the conductive plugs 56.

The die connectors 62 may be conductive pillars (for example, comprising a metal such as copper, aluminum, tungsten, nickel, or alloys thereof), and are mechanically and electrically coupled to the interconnect 60. The die connectors 62 may be formed by, for example, plating, or the like. The die connectors 62 electrically couple the respective integrated circuits of the integrated circuit die 50.

The dielectric material 64 is on the active surface of the integrated circuit dies 50, such as on the interconnect 60. The dielectric material 64 laterally encapsulates the die connectors 62, and the dielectric material 64 is laterally coterminous with the integrated circuit die 50. The dielectric material 64 is a silicon containing dielectric layer, and may be formed of silicon oxide, SiON, SiN, or the like, and may be formed by a deposition process such as CVD, PECVD, PVD, ALD, or the like. The dielectric material 64 may be a topmost layer of the interconnect 60.

Figure 2A:
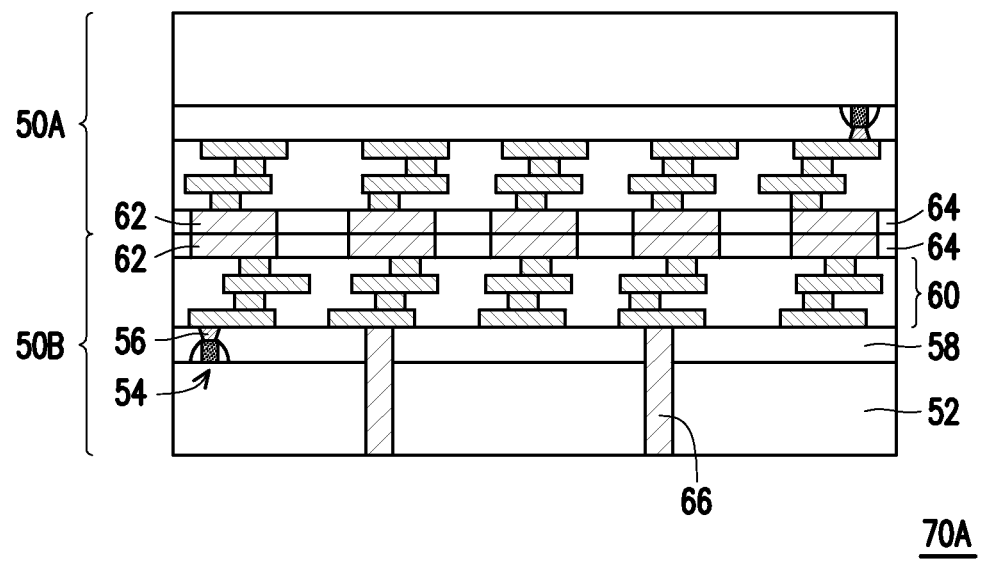
FIGS. 2A and 2B are cross-sectional views of die stacks, in accordance with some embodiments.
Figure 2B:
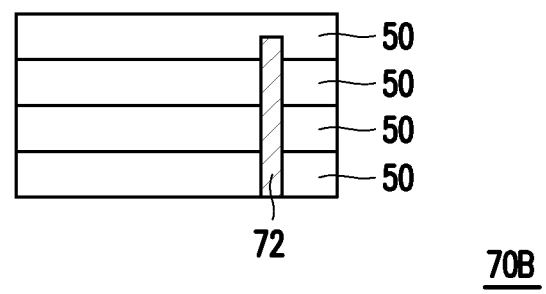

FIGS. 2A and 2B are cross-sectional views of die stacks 70A and 70B, in accordance with some embodiments. The die stack 70A and 70B may each have a single function (e.g., a logic device, memory die, etc.), or may have multiple functions (e.g., a SoC). In a particular embodiment, the die stack 70A is a processor and the die stack 70B is a memory module. The die stacks 70A and 70B may alternatively be referred to as die stacks 70 here, where references to the die stacks 70 refer to either the die stack 70A or the die stack 70B.

As shown in FIG. 2A, the die stack 70A includes two bonded integrated circuit dies 50. The die stack 70A may be a processor such as a central processing unit (CPU), graphics processing unit (GPU), application-specific integrated circuit (ASIC), or the like. In a specific embodiment, the die stack 70A is a GPU. In some embodiments, a first integrated circuit die 50A and a second integrated circuit die 50B are bonded such that the active surfaces are facing each other ("face-to-face"). The first and second integrated circuit dies 50 may be connected by hybrid bonding, fusion bonding, direct bonding, dielectric bonding, metal bonding, or the like. In some embodiments, the first integrated circuit die 50A is a processor die, and the second integrated circuit die 50B is an interface die. The interface die bridges the processor die to memory dies, and translates commands between the processor and memory dies.

In embodiments where the first and second integrated circuit dies 50 are bonded by hybrid bonding, covalent bonds are formed with oxide layers, such as the dielectric material 64 in each die. Before performing the bonding, a surface treatment may be performed on the first and/or second integrated circuit dies 50, forming OH bonds in the top of the dielectric material 64. Next, a pre-bonding process may be performed, where the die connectors 62 and dielectric material 64 of the first and second integrated circuit dies 50 are aligned and pressed against together to form weak bonds. After the pre-bonding process, the first and second integrated circuit dies 50 are annealed to strengthen the weak bonds. During the annealing, OH bonds in the top of the dielectric material 64 break to form Si—O—Si bonds between the first and second integrated circuit dies 50, thereby strengthening the bonds. During the hybrid bonding, metal bonding also occurs between the die connectors 62.

Vias 66 may be formed through one of the integrated circuit dies 50 so that external connections may be made. The vias 66 may be through silicon vias (TSVs). In the embodiment shown, the vias 66 are formed in the second integrated circuit die 50B (e.g., the interface die). The vias 66 extend through the substrate 52 of the respective integrated circuit die 50, and may extend through the ILDs 58 to be physically and electrically connected to the metallization patterns of the interconnect 60.

As shown in FIG. 2B, the die stack 70B includes multiple integrated circuit dies 50 connected by a via 72. The via 72 may be, e.g., a TSV. The die stack 70B may be a memory device such as dynamic random access memory (DRAM) dies, static random access memory (SRAM) dies, hybrid memory cube (HMC) modules, high bandwidth memory (HBM) modules, or the like. In a specific embodiment, the die stack 70B is a HBM module.

Die stacks, such as the die stacks 70, may trap heat, becoming hot spots in subsequently formed device packages. In particular, die stacks including processing devices (such as the die stack 70A) may have a high power density. For example, in an embodiment where the die stack 70A is a GPU, the power density of the resulting device packages may be from about 50 W/cm$^2$ to about 300 W/cm$^2$. During operation, heat may be trapped at the interface of the processor dies and interface die.

Figure 8A:
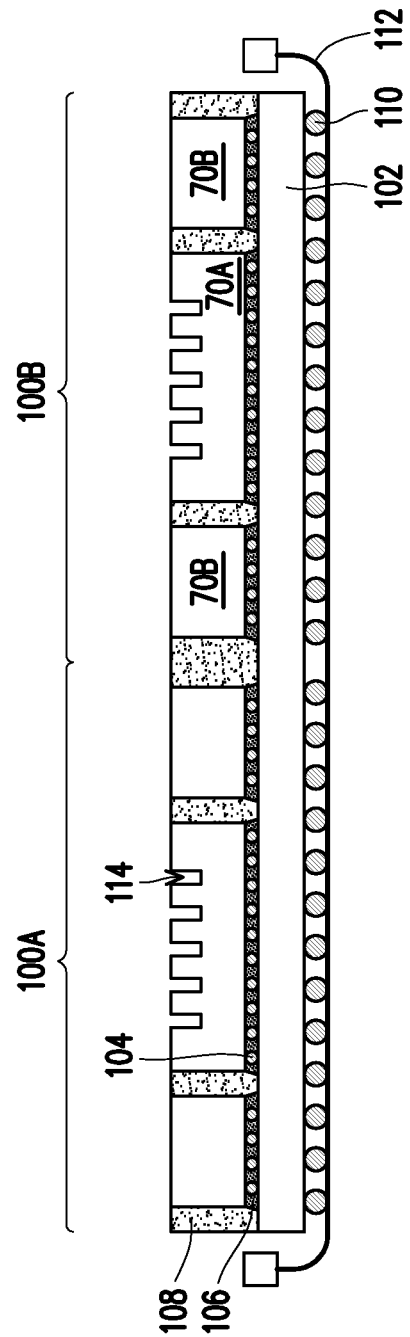
Figure 8B:
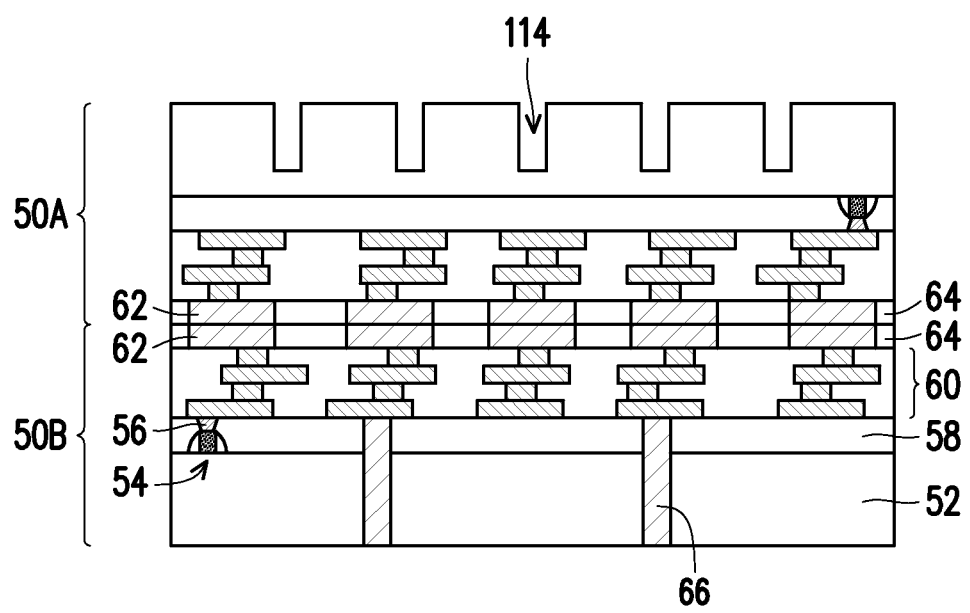
Figure 9:
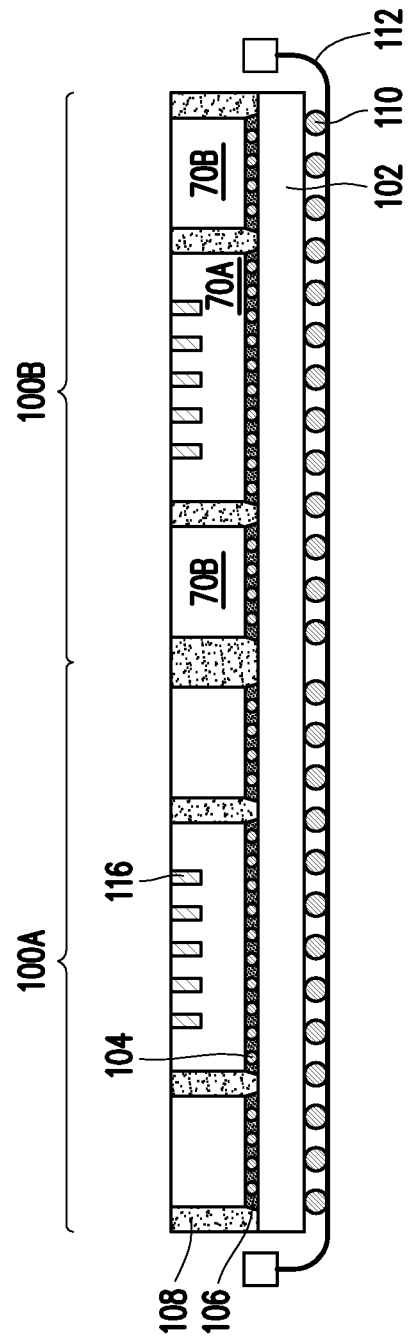
Figure 10:
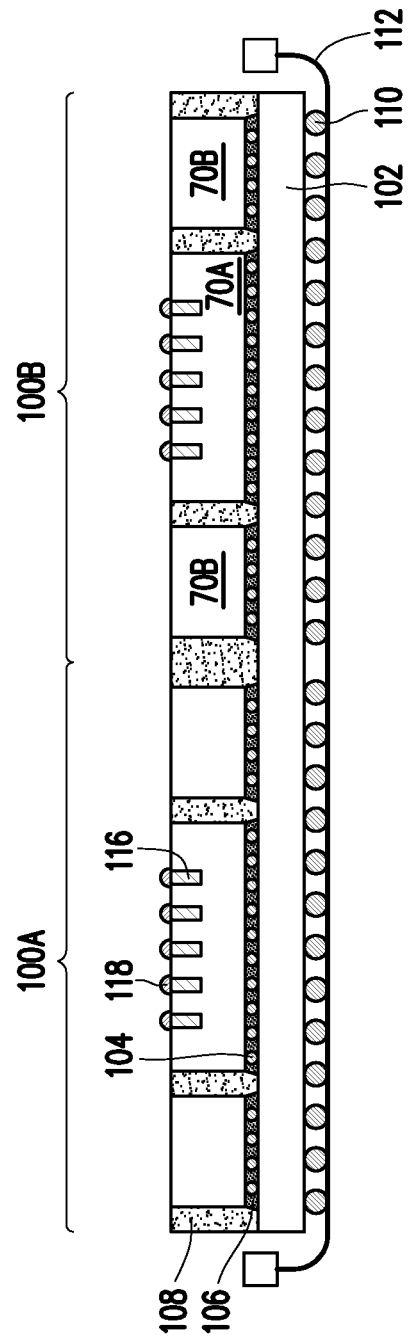
Figure 11:
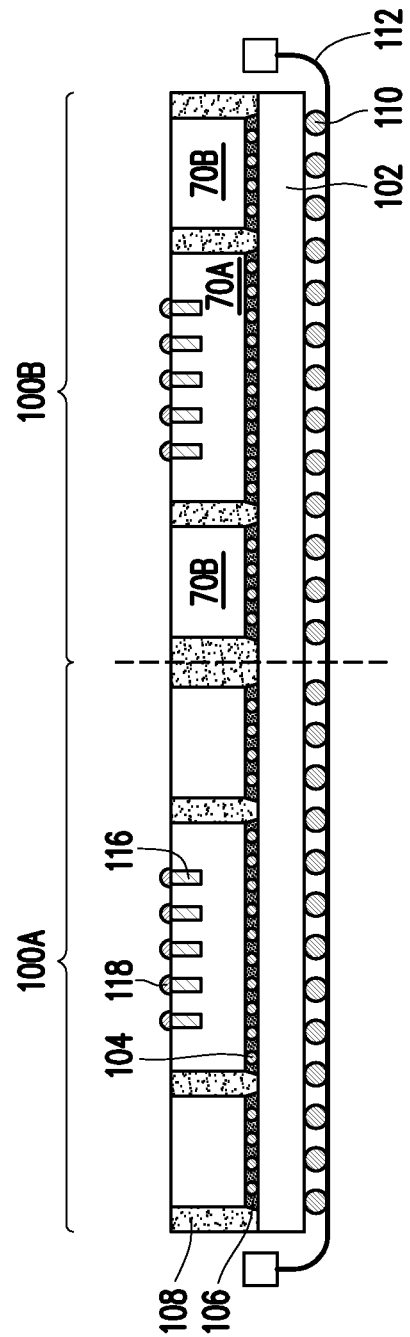
Figure 12:
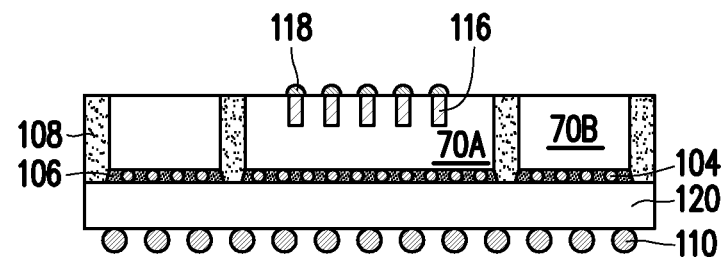
Figure 13:
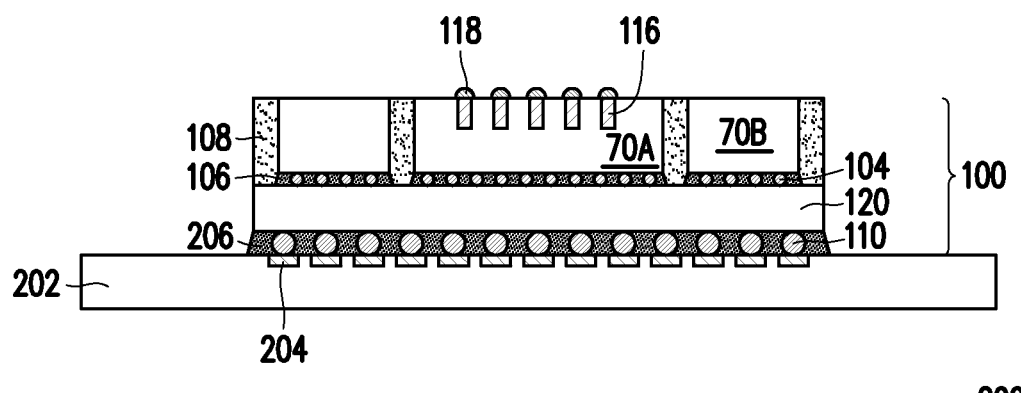

FIGS. 3 through 13 are various views of intermediate steps during a process for forming a semiconductor device 300, in accordance with some embodiments. FIGS. 3 through 13 are cross-sectional views. In FIGS. 3 through 9, a first device package 100 is formed by bonding various integrated circuit dies to a wafer 102. In an embodiment, the first device package 100 is a chip-on-wafer (CoW) package, although it should be appreciated that embodiments may be applied to other 3DIC packages. FIG. 10 shows the resulting first device package 100. In FIGS. 11 through 12, a second device package 200 is formed by mounting the first device package 100 to a substrate. In an embodiment, the device package 200 is a chip-on-wafer-on-substrate (CoWoS) package, although it should be appreciated that embodiments may be applied to other 3DIC packages. FIG. 13 shows the semiconductor device 300 implementing the resulting second device package 200.

The wafer 102 may have a variety of devices formed in it. In particular, interposers, integrated circuit devices, or the like may be formed in the wafer 102, which may include multiple device regions 100A and 100B (singulated in subsequent steps to form the first device packages 100).

In some embodiments, interposers are formed in the wafer 102. The interposers have interconnect structures for electrically connecting active devices (not shown) in the integrated circuit dies to form functional circuits. In such embodiments, the wafer 102 includes a semiconductor substrate having a front surface (e.g., the surface facing upwards in FIG. 3), and a back surface (e.g., the surface facing downwards in FIG. 3). An interconnect structure is formed on the back surface of the semiconductor substrate. Through-vias are formed in the semiconductor substrate extending from the interconnect structure to the front surface of the semiconductor substrate. Metal lines and vias are formed in an interconnect structure on the semiconductor substrate by, e.g., a dual damascene process. The metal lines and vias may be electrically connected to the through-vias. The interposers may (or may not) be free from active devices such as transistors and diodes, and may (or may not) be free from devices such as resistors, inductors, capacitors, and the like.

Although embodiments illustrated herein are discussed in the context of the wafer 102 having interposers formed therein, it should be appreciated that other types of devices may be formed in the wafer 102. For example, integrated circuit devices such as logic devices may be formed in the wafer 102. In such embodiments, the wafer 102 includes a semiconductor substrate with active and/or passive devices formed therein. The semiconductor substrate may be silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate, and may be interconnected by interconnect structures formed by, for example, metallization patterns in one or more dielectric layers on the semiconductor substrate to form an integrated circuit.

Figure 3:
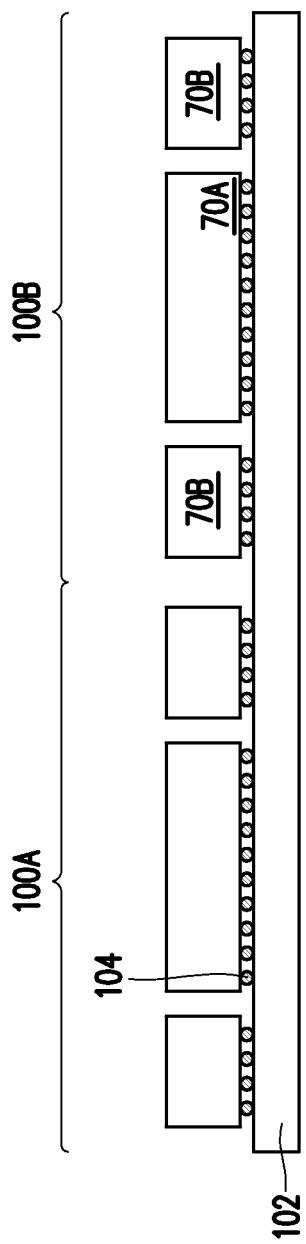
FIGS. 3, 4, 5, 6, 7, 8A, 8B, 9, 10, 11, 12, 13, 14, and 15 are various views of intermediate steps during a process for forming a semiconductor device, in accordance with some embodiments.

In FIG. 3, the die stacks 70 are attached to the wafer 102 with die connectors 104. In an embodiment, one die stack 70A (e.g., a GPU) and multiple die stacks 70B (e.g., HBM) may be placed on each device region of the wafer 102. The die stacks 70 may be attached to the wafer 102 using, for example, a pick-and-place tool. The die connectors 104 may be formed from a conductive material such as solder, copper, aluminum, gold, nickel, silver, palladium, tin, the like, or a combination thereof. In some embodiments, the die connectors 104 are formed by initially forming a layer of solder through methods such as evaporation, electroplating, printing, solder transfer, ball placement, or the like. Once a layer of solder has been formed on the structure, a reflow may be performed in order to shape the die connectors 104 into desired bump shapes. The die connectors 104 form joints between corresponding connectors on the wafer 102 and the die stacks 70, and electrically connect the wafer 102 to the die stacks 70.

Figure 4:
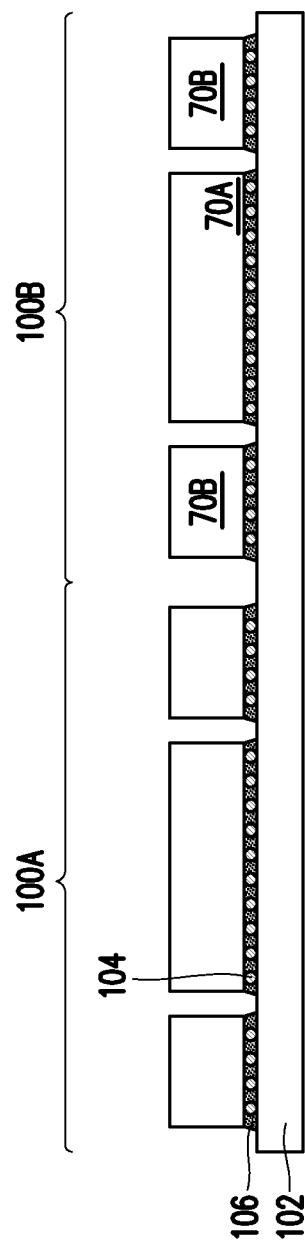

In FIG. 4, an underfill 106 may be formed between the die stacks 70 and the wafer 102, surrounding the die connectors 104. The underfill 106 may be formed by a capillary flow process after the die stacks 70 are attached, or may be formed by a suitable deposition method before the die stacks 70 are attached.

Figure 5:
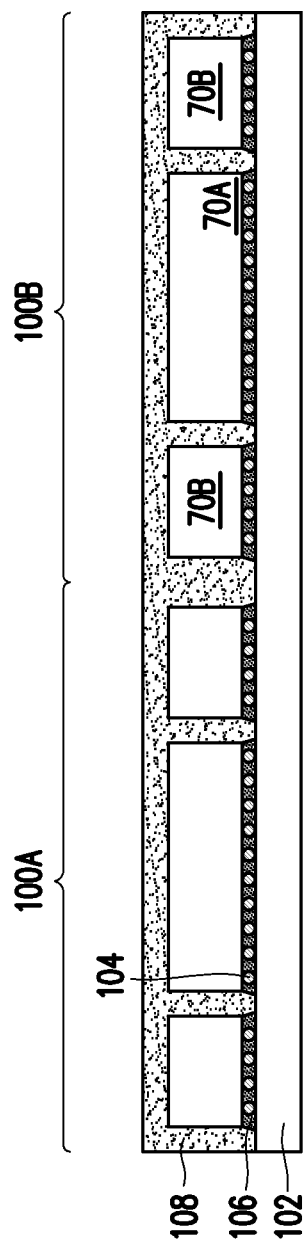

In FIG. 5, an encapsulant 108 is formed on the various components. The encapsulant 108 may be a molding compound, epoxy, or the like, and may be applied by compression molding, transfer molding, or the like. The encapsulant 108 may be formed over the wafer 102 such that the die stacks 70 are buried or covered. The encapsulant 108 is then cured.

Figure 6:
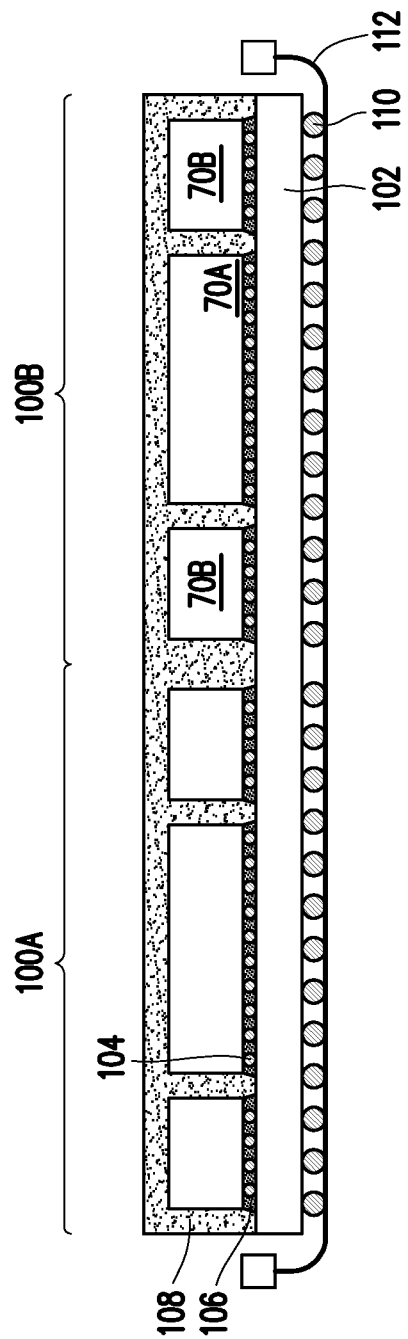

In FIG. 6, conductive connectors 110 are formed on the back side of the wafer 102. The back side of the wafer 102 may be thinned before the conductive connectors 110 are formed. The thinning may be accomplished by a chemical-mechanical polish (CMP), a grinding process, or the like. The conductive connectors 110 are electrically connected to features of the wafer 102 (e.g., logic devices, interposers, etc.), and may be BGA connectors, solder balls, metal pillars, controlled collapse chip connection (C4) bumps, micro bumps, electroless nickel-electroless palladium-immersion gold technique (ENEPIG) formed bumps, or the like. In some embodiments, the conductive connectors 110 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. After the conductive connectors 110 are formed, the wafer 102 may be placed on tape 112 for subsequent processing steps.

Figure 7:
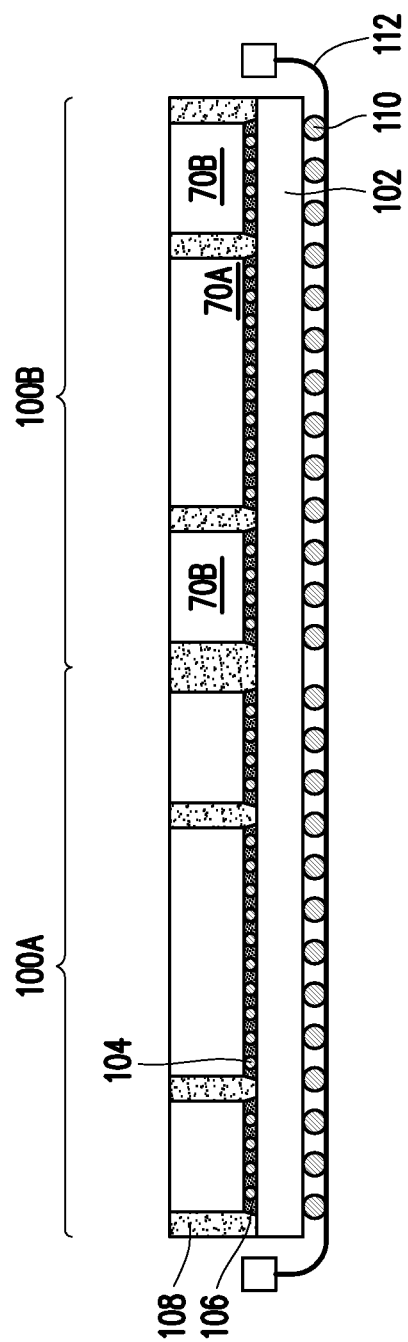

In FIG. 7, the encapsulant 108 is thinned to expose top surfaces of the die stacks 70. The thinning may be accomplished by a CMP, a grinding process, or the like. After the thinning, top surfaces of the encapsulant 108 and die stacks 70 are level.

In FIGS. 8A and 8B, recesses 114 are formed in the die stacks 70. FIG. 8A is a cross-sectional view showing processing at the level of the wafer 102, and FIG. 8B is a cross-sectional view showing detailed processing at the level of the die stack 70A. The recesses 114 are through substrate via (TSV) openings, which are filled later as discussed below. The recesses 114 are formed in the substrate 52 of the topmost die of the die stacks 70. The recesses 114 extend from the back side of the substrates 52, and may be formed so as to extend either completely through or only partially into the substrates 52. In an embodiment, the recesses 114 extend only partially into the substrates 52 such that the recesses 114 extend from the back surface of the substrates 52 to a depth of less than the total height of the substrates 52. Accordingly, while the depth of the recesses 114 is dependent upon the overall design of the first device packages 100, in some embodiments the depth may be from about 50 µm to about 700 µm below the top surface of the substrates 52, such as a depth of about 300 µm. Such a depth allows the subsequently formed TSVs to be good conductors of heat for cooling the die stacks 70 while keeping manufacturing costs low. Further, while the width of the recesses 114 is dependent upon the overall design of the first device packages 100, in some embodiments the width may be from about 10 µm to about 200 µm. The recesses 114 may be formed by acceptable photolithography and etching techniques. For example, a suitable photoresist may be applied to the wafer 102 (e.g., on the encapsulant 108 and die stacks 70), and developed. The developed photoresist may then be used as an etching mask in an etching process for forming the recesses 114. The etching process may be an anisotropic wet or dry etch.

Once the recesses 114 have been formed, the recesses 114 may be filled with a liner (not separately illustrated). The liner may be a dielectric material such as silicon nitride, silicon oxide, a dielectric polymer, combinations of these, or the like, and may be formed by a process such as CVD, oxidation, PVD, ALD, or the like.

The recesses 114 may also be filled with a barrier layer (also not separately illustrated) over the liner. The barrier layer may be a conductive material such as titanium nitride, although other materials, such as tantalum nitride, titanium, another dielectric, or the like may alternatively be utilized. The barrier layer may be formed using a CVD process, such as PECVD, however, other processes such as sputtering or metal organic chemical vapor deposition (MOCVD), ALD, or the like may alternatively be used. The barrier layer may be formed so as to contour to the underlying shape of the recesses 114.

In FIG. 9, a conductive material is formed in the recesses 114, thereby forming dummy TSVs 116. The conductive material may be copper, although other suitable materials such as aluminum, tungsten, alloys, doped polysilicon, combinations thereof, and the like, may alternatively be utilized. The conductive material may be formed by depositing a seed layer in the recesses 114 and then electroplating copper onto the seed layer, filling and overfilling the recesses 114. Once the recesses 114 have been filled, excess barrier layer and excess conductive material outside of the recesses 114 may be removed through a grinding process such as a CMP, although any suitable removal process may be used.

After the conductive material is formed, an annealing process may be performed. For example, a thermal anneal may be performed at a temperature of about 400° C. for a time span of about 1 hour. The anneal may strengthen the interface of the dummy TSVs 116 and substrates 52, and stabilize the grain structure of the electroplated conductive material.

The dummy TSVs 116 are electrically isolated from surrounding devices. Although the dummy TSVs 116 are formed in the substrates 52 of the integrated circuit dies 50, which themselves may contain devices 54, the dummy TSVs 116 are electrically isolated from the active side of the integrated circuit dies 50, e.g., from the devices 54 of the integrated circuit dies 50. For example, the recesses 114 may be formed in the substrate 52 of the integrated circuit dies 50 such that the dummy TSVs 116 are surrounded by non-conductive materials on all sides except the top side (e.g., the side of the dummy TSVs 116 level with the back side of the substrate 52). The non-conductive materials may be insulating materials, bulk semiconductor materials (e.g., a semiconductor material with no devices formed therein), or the like. The dummy TSVs 116 may not be physically or electrically connected to the devices 54, the metallization of the interconnect 60, or the like.

Although the dummy TSVs 116 are only illustrated as being formed in the die stack 70A, it should be appreciated that the dummy TSVs 116 could be formed in any or all of the die stacks 70. For example, the dummy TSVs 116 could be formed in only the die stack 70A, only the die stack 70B, or both the die stacks 70A and 70B.

In FIG. 10, dummy connectors 118 are formed on respective dummy TSVs 116. The dummy connectors 118 may be formed on each of the respective dummy TSVs 116, or on a subset of the dummy TSVs 116 (e.g., the dummy connectors 118 may only be formed on a subset of the dummy TSVs 116 and may not be formed on remaining ones of the dummy TSVs 116). Because the dummy connectors 118 are formed on the dummy TSVs 116, they are also electrically isolated from the active side of the substrates 52. The dummy connectors 118 may be formed from a conductive material such as solder, copper, aluminum, gold, nickel, silver, palladium, tin, the like, or a combination thereof. In the embodiment shown, the dummy connectors 118 are bumps formed of a reflowable material, such as solder, smart solder, or the like. The dummy connectors 118 may be formed such that they only cover respective dummy TSVs 116, or may be wider than the dummy TSVs 116 such that they cover respective dummy TSVs 116 and extend along top surfaces of the substrate 52 of the topmost integrated circuit dies 50. The dummy connectors 118 thermally couple the dummy TSVs 116 to an overlying heat spreader (shown below). The dummy connectors 118 are sufficiently large so that sufficient heat may be transferred from the dummy TSVs 116 during operation; in an embodiment, the dummy connectors 118 have a height of from about 25 µm to about 100 µm, such as about 50 µm.

In FIG. 11, the wafer 102 and encapsulant 108 are singulated by a singulation process, thereby forming the first device packages 100. As a result of the singulation process, the wafer 102 is singulated into interposers 120, with each of the first device packages 100 having an interposer 120. The singulation may be performed while the wafer 102 is on the tape 112. Singulation is performed along scribe line regions e.g., between adjacent device regions, e.g., the device regions 100A and 100B. In some embodiments, the singulation process includes a sawing process, a laser process, or a combination thereof.

FIG. 12 shows a resulting first device package 100 after singulation. As a result of the singulation process, edges of the interposers 120 and encapsulant 108 are coterminous. In other words, the outer sidewalls of the interposers 120 have the same width as the outer sidewalls of the encapsulant 108.

In FIG. 13, the second device package 200 is formed by mounting the first device package 100 to a package substrate 202. The package substrate 202 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 202 may be a SOI substrate. Generally, an SOI substrate includes a layer of a semiconductor material such as epitaxial silicon, germanium, silicon germanium, SOI, SGOI, or combinations thereof. The package substrate 202 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 202.

The package substrate 202 may include active and passive devices (not shown). As one of ordinary skill in the art will recognize, a wide variety of devices such as transistors, capacitors, resistors, combinations of these, and the like may be used to generate the structural and functional requirements of the design for the second device package 200. The devices may be formed using any suitable methods.

The package substrate 202 may also include metallization layers and vias (not shown) and bond pads 204 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 202 is substantially free of active and passive devices.

In some embodiments, the conductive connectors 110 are reflowed to attach the first device package 100 to the bond pads 204, thereby bonding the interposer 120 to the package substrate 202. The conductive connectors 110 electrically and/or physically couple the package substrate 202, including metallization layers in the package substrate 202, to the second device package 200. In some embodiments, passive devices (e.g., surface mount devices (SMDs), not illustrated) may be attached to the second device package 200 (e.g., bonded to the bond pads 204) prior to mounting on the package substrate 202. In such embodiments, the passive devices may be bonded to a same surface of the second device package 200 as the conductive connectors 110.

The conductive connectors 110 may have an epoxy flux (not shown) formed thereon before they are reflowed with at least some of the epoxy portion of the epoxy flux remaining after the second device package 200 is attached to the package substrate 202. This remaining epoxy portion may act as an underfill to reduce stress and protect the joints resulting from the reflowing the conductive connectors 110.

An underfill 206 may be formed between the first device package 100 and the package substrate 202, surrounding the conductive connectors 110. The underfill 206 may be formed by a capillary flow process after the first device package 100 is attached or may be formed by a suitable deposition method before the first device package 100 is attached.

Figure 14:
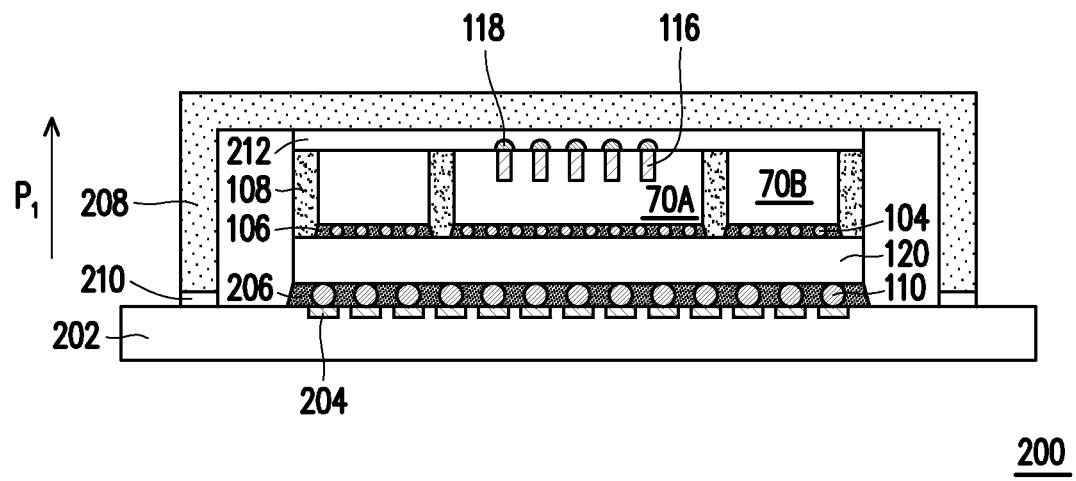

In FIG. 14, a heat spreader 208 is attached to the first device package 100 and package substrate 202, covering and surrounding the first device package 100. The heat spreader 208 may be formed from a material with high thermal conductivity, such as steel, stainless steel, copper, the like, or combinations thereof. In some embodiments (discussed below), the heat spreader 208 is coated with another metal, such as gold, nickel, or the like. In some embodiments, the heat spreader 208 is a single contiguous material. In some embodiments, the heat spreader 208 includes multiple pieces that may be the same or different materials.

The heat spreader 208 is adhered to the first device package 100 and package substrate 202. An adhesive 210 attaches the heat spreader 208 to the package substrate 202. The adhesive 210 may be epoxy, glue, or the like, and may be a thermally conductive material. A thermal interface material (TIM) 212 attaches the heat spreader 208 to the first device package 100. The TIM 212 may be a polymeric material, solder paste, indium solder paste, or the like, and may be dispensed on the first device package 100, such as on the die stacks 70, encapsulant 108, and dummy connectors 118. Notably, the TIM 212 surrounds the dummy connectors 118. The TIM 212 is formed to a thickness sufficiently large to bury the dummy connectors 118. For example, in embodiments where the dummy connectors 118 are formed to a height of about 50 μm, the TIM 212 is formed to a thickness of from about 25 μm to about 200 μm, such as about 100 μm.

The TIM 212 thermally couples the first device package 100 and heat spreader 208. Because the heat spreader 208 is the primary means of heat dissipation for the first device package 100, the thermal conductivity of the TIM 212 may be a thermal bottleneck for the overall thermal resistance along a thermal path $P_1$ extending between the heat spreader 208 and the bottommost die of the die stacks 70 during operation. Because the dummy connectors 118 are buried in the TIM 212, the thermal resistance along the thermal path $P_1$ may be decreased. In an embodiment, addition of the dummy connectors 118 may decrease the thermal resistance along the thermal path $P_1$ by a factor of ten or more. Further, the dummy TSVs 116 may also decrease the thermal resistance along the thermal path $P_1$.

Figure 15:
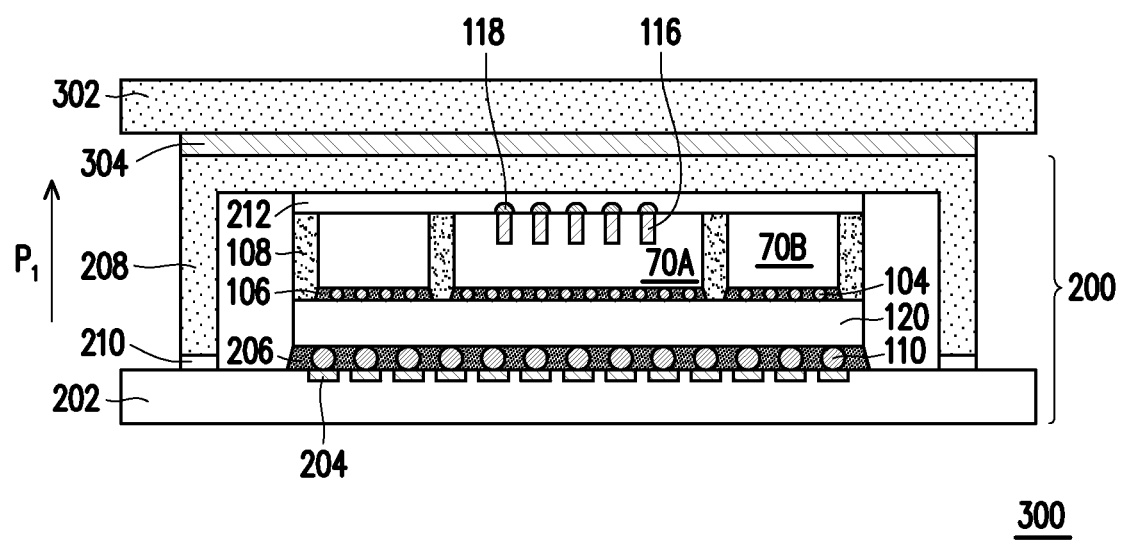

FIG. 15 shows a semiconductor device 300 implementing the resulting second device package 200. In the semiconductor device 300, a heatsink 302 is adhered to the second device package 200 with a TIM 304. The heatsink 302 may be formed of a material selected from the candidate materials for forming the heat spreader 208. The heatsink 302 may be formed of the same material as the heat spreader 208, or may include different materials. The TIM 304 may be similar to the TIM 212, or may be different. The semiconductor device 300 may be formed in a different process after the process for manufacturing the second device package 200. For example, the second device package 200 may be manufactured in a first process, and the semiconductor device 300 may formed in a second process after manufacture and delivery of the second device package 200.

Figure 16:
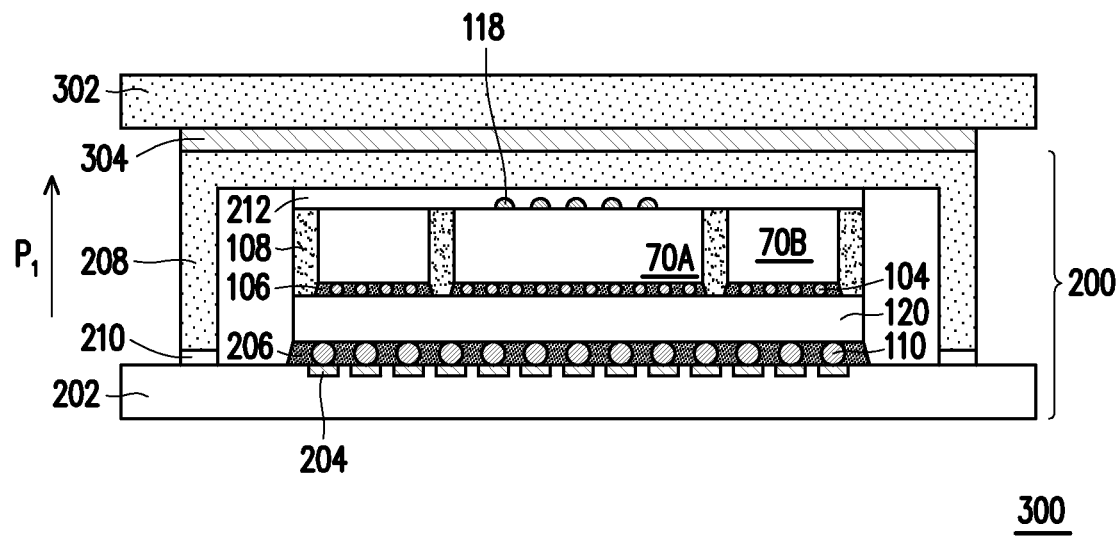
FIG. 16 shows the semiconductor device, in accordance with some other embodiments.

FIG. 16 shows the semiconductor device 300, in accordance with some other embodiments. In the embodiment shown, the dummy TSVs 116 are not formed such that the die stacks 70 are substantially free of TSVs. In such embodiments, the dummy connectors 118 are surrounded by non-conductive materials on all sides. Although the dummy TSVs 116 may decrease the thermal resistance along the thermal path $P_1$, they are costly to manufacture. Forming the dummy connectors 118 in the TIM 212 may sufficiently decrease the thermal resistance along the thermal path $P_1$, reducing manufacturing costs by avoiding formation of TSVs.

Figure 17:
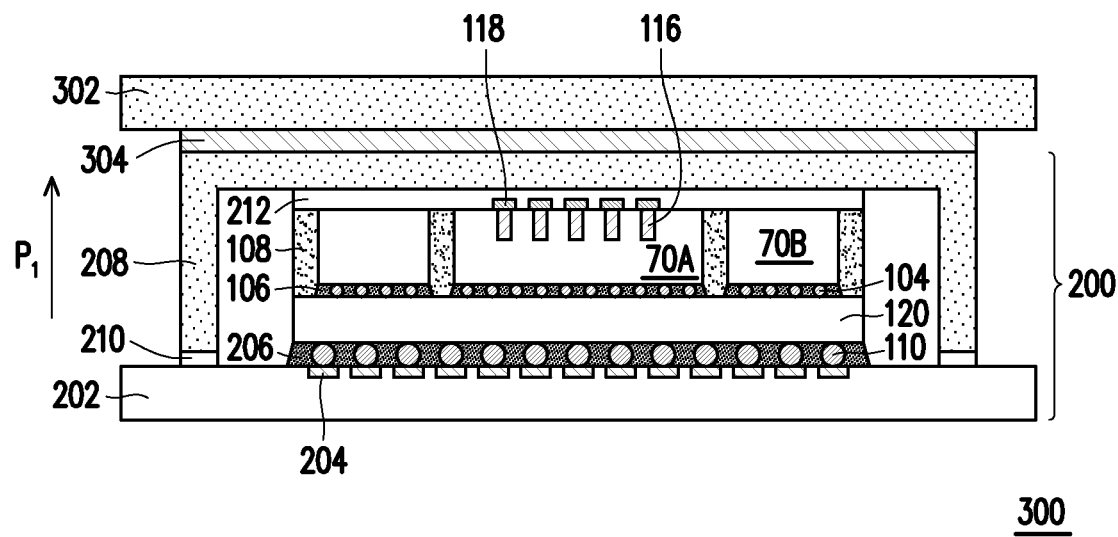
FIG. 17 shows the semiconductor device, in accordance with some other embodiments.

FIG. 17 shows the semiconductor device 300, in accordance with some other embodiments. In the embodiment shown, the dummy connectors 118 are studs, pillars, or bumps formed of a conductive material such as copper, aluminum, tungsten, alloys, doped polysilicon, the like, or a combination thereof. In a particular embodiment, the dummy connectors 118 are dummy copper pillars. Forming the copper pillars buried in the TIM 212 may decrease the thermal resistance along the thermal path $P_1$.

The dummy copper pillars may be formed by acceptable photolithography and plating processes. For example, after dummy TSVs 116 are formed in the recesses 114 (see, e.g., FIG. 9), a suitable photoresist (not shown) may be applied to the wafer 102 (e.g., on the encapsulant 108 and die stacks 70), and developed. The photoresist may be patterned with openings exposing the dummy TSVs 116. The openings in the photoresist may be lined with a barrier layer. The barrier layer may be a conductive material such as titanium nitride, tantalum nitride, titanium, another dielectric, or the like, and may be formed by CVD, PECVD, MOCVD, ALD, or the like. The conductive material may then be formed in the openings, thereby forming the dummy connectors 118 (e.g., dummy copper pillars). The conductive material may be formed by depositing a seed layer in the openings and then electroplating the conductive material onto the seed layer, filling the openings. The photoresist may then be removed by ashing, stripping, or the like.

Figure 18:
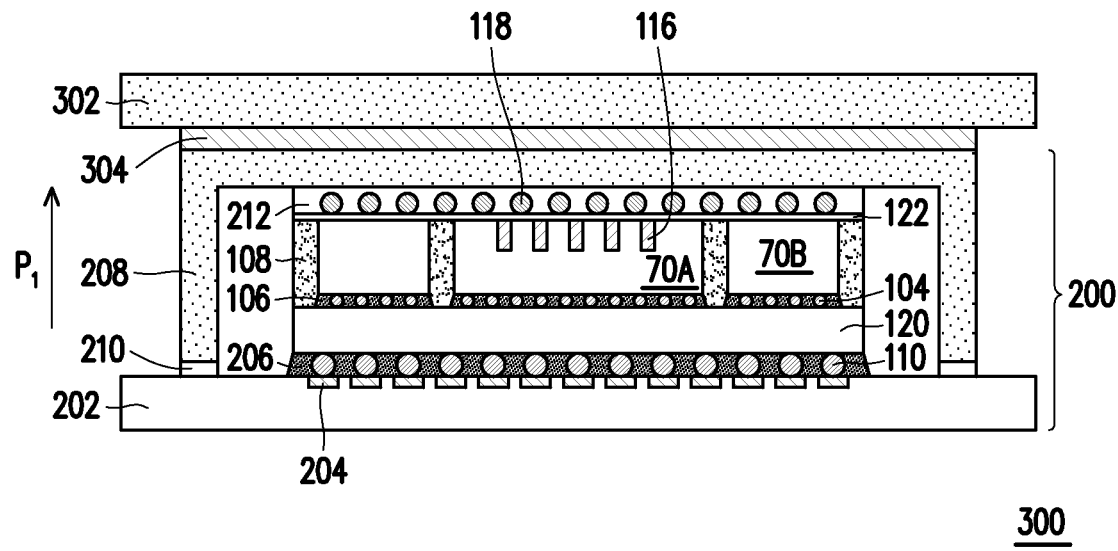
FIG. 18 shows the semiconductor device, in accordance with some other embodiments.

FIG. 18 shows the semiconductor device 300, in accordance with some other embodiments. In the embodiment shown, an adhesive 122 is formed on the first device package 100. The adhesive 122 is on the die stacks 70, encapsulant 108, and dummy TSVs 116. The adhesive 122 may be dispensed on the first device package 100 before or after the first device package 100 is singulated. The adhesive 122 may be a polymeric material, solder paste, thermal adhesive, or the like, and may be formed to a thickness of from about 25 μm to about 150 μm. The dummy connectors 118 are formed on the adhesive 122, and may be formed by a pick and place method. In the embodiment shown, the dummy connectors 118 are bumps such as solder balls. In some embodiments, the dummy connectors 118 are not aligned over the dummy TSVs 116. The TIM 212 is dispensed on the adhesive 122 and around the dummy connectors 118. The dummy connectors 118 are buried in the TIM 212. The adhesive 122 may cause the dummy connectors 118 to conform to the shape of the first device package 100, including conforming to any warpage that may have been introduced in the first device package 100. As such, the overall thermal resistance along the thermal path P₁ may be reduced.

Figure 19:
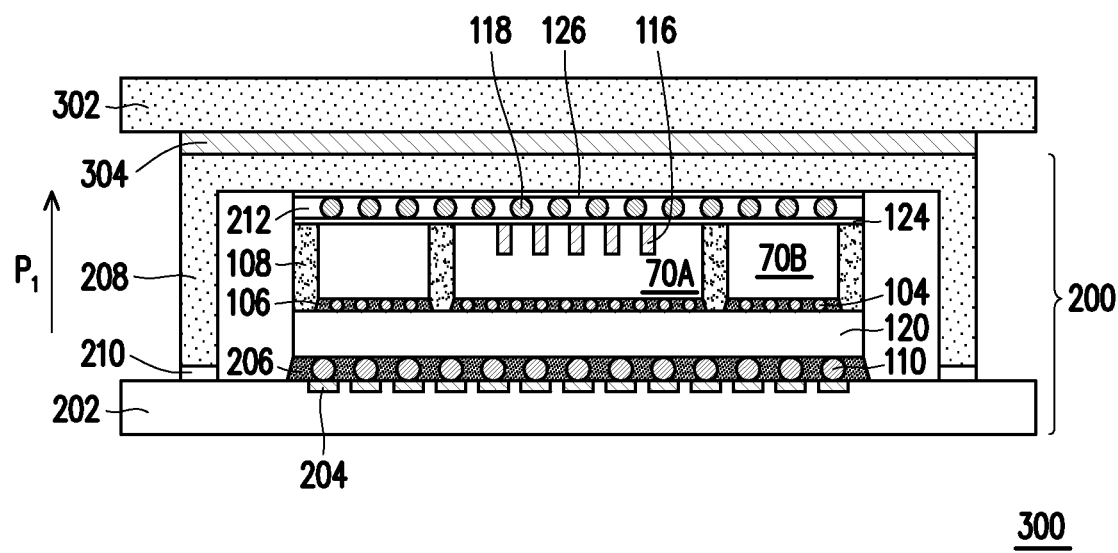
FIG. 19 shows the semiconductor device, in accordance with some other embodiments.

FIG. 19 shows the semiconductor device 300, in accordance with some other embodiments. In the embodiment shown, dummy metallization 124 is formed on the first device packages 100. The dummy metallization 124 may be formed on the first device package 100 before or after the first device package 100 is singulated. The dummy metallization 124 may be formed from a conductive material or metal such as gold, indium, copper, the like, or combinations thereof. The dummy metallization 124 may be formed by depositing a seed layer over the wafer 102 (e.g., on the encapsulant 108, die stacks 70, and dummy TSVs 116), and then electroplating the conductive material onto the seed layer. The dummy metallization 124 may also be formed by sputtering the conductive material onto the wafer 102. Like the dummy TSVs 116, the dummy metallization 124 may be electrically isolated from the active and/or passive devices of the die stacks 70 (e.g., the devices 54) and other surrounding devices.

The dummy connectors 118 are formed on the dummy metallization 124, and may be formed by a pick and place method. In the embodiment shown, the dummy connectors 118 are bumps such as solder balls. The TIM 212 is dispensed on the dummy metallization 124 and around the dummy connectors 118. The dummy connectors 118 are not buried in the TIM 212. Rather, after formation, the dummy connectors 118 have top surfaces level with or extending above the TIM 212. When the heat spreader 208 is attached to the first device package 100, the dummy connectors 118 are reflowed to bond the dummy metallization 124 to the heat spreader 208. Solder joints are thereby formed in the TIM 212 bonding the dummy metallization 124 and heat spreader 208. In the embodiment shown, the heat spreader 208 is coated with another metal, such as nickel. During reflow, the nickel coating of the heat spreader 208 mingles with the material of the TIM 212 and dummy connectors 118 to form an intermetallic compound (IMC) 126 at the interface of the heat spreader 208 and TIM 212. The IMC 126 may have different regions; for example, the IMC 126 may have first regions where a first IMC is formed from the materials of the dummy connectors 118 and heat spreader 208, and may have second regions where a second IMC is formed from the materials of the TIM 212 and heat spreader 208. The dummy metallization 124 and IMC 126 may have a high thermal conductivity and may conform to the shape of the first device package 100, including conforming to any warpage that may have been introduced in the first device package 100. As such, the overall thermal resistance along the thermal path P₁ may be reduced.

Figure 20:
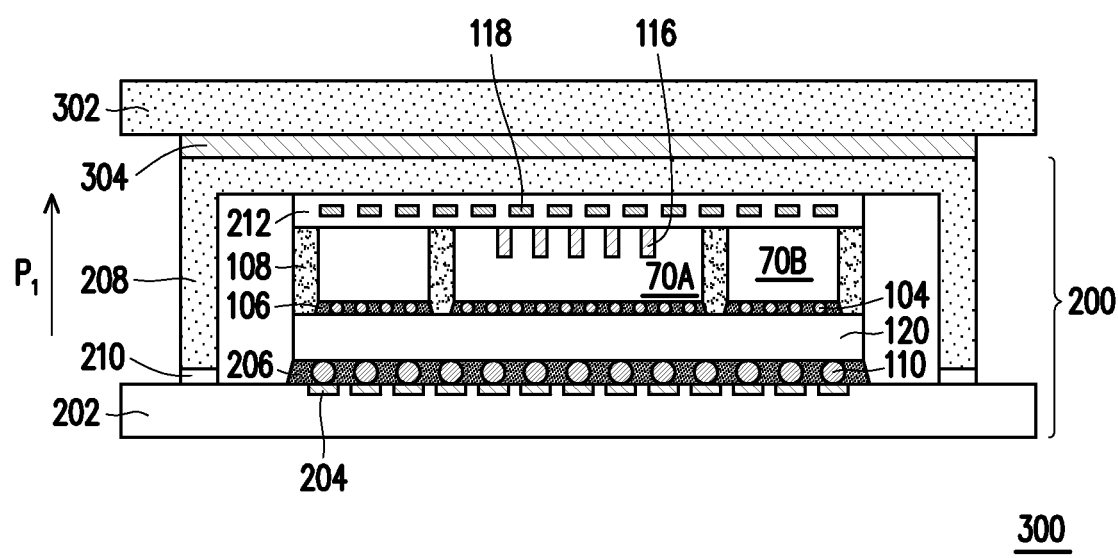
FIG. 20 shows the semiconductor device, in accordance with some other embodiments.
Figure 21:
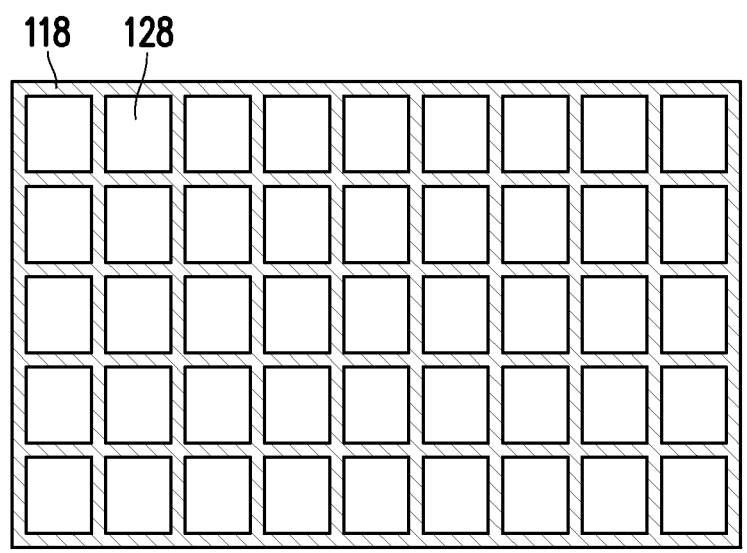
FIG. 21 shows a dummy connector, in accordance with some other embodiments.

FIG. 20 shows the semiconductor device 300, in accordance with some other embodiments. In the embodiment shown, the dummy connectors 118 are part of a patterned metal sheet (see, e.g., FIG. 21, which shows a top-down view of the patterned metal sheet). For example, the patterned metal sheet may be copper foil, such as that used for radio frequency interference (RFI) shielding, and may include openings 128. The patterned metal sheet may have a thickness of from about 11 µm to about 25 µm. The patterned metal sheet is disposed in the TIM 212 such that the TIM 212 is disposed between the patterned metal sheet and the first device package 100, and is also disposed between the patterned metal sheet and the heat spreader 208. The patterned metal sheet may have a high thermal conductivity and may conform to the shape of the first device package 100, including conforming to any warpage that may have been introduced in the first device package 100. As such, the overall thermal resistance along the thermal path P₁ may be reduced.

Figure 22:
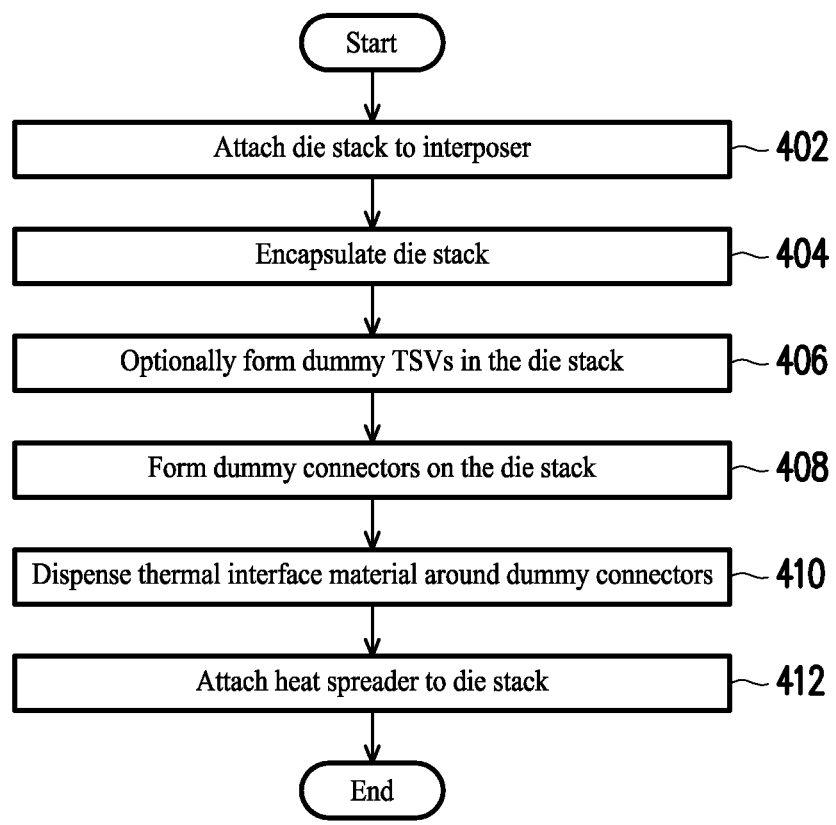
FIG. 22 shows a flow diagram of a method for manufacturing a semiconductor device, in accordance with some other embodiments.

FIG. 22 shows a flow diagram of a method 400 for manufacturing the semiconductor device 300, in accordance with some other embodiments. In step 402, a die stack, such as the die stack 70A, is attached to the interposer 120. In step 404, the die stack 70A is encapsulated. In step 406, the dummy TSVs 116 are optionally formed in the die stack. In step 408, the dummy connectors 118 are formed on the die stack. The dummy connectors 118 may be formed in accordance with any embodiments herein. In step 410, the TIM 212 is dispensed around the dummy connectors 118. In step 412, the heat spreader 208 is attached to the die stack using the TIM 212. In subsequent processing steps, the heatsink 302 may be attached to the heat spreader 208.

Embodiments may achieve advantages. The thermal conductivity of the TIM 212 may be a significant thermal bottleneck in stacked devices. Forming the dummy connectors 118 in the TIM 212 and forming the dummy TSVs 116 in the die stacks 70 may decrease the thermal resistance along the thermal path P₁. Addition of other features such as the adhesive 122, dummy metallization 124, and eutectic compound 126 may help the TIM 212 conform to any warpage that may be introduced in the device package 100. As such, the overall thermal resistance along the thermal path P₁ may be reduced.

In an embodiment, a device includes: a die stack over and electrically connected to an interposer, the die stack including a topmost integrated circuit die including: a substrate having a front side and a back side opposite the front side, the front side of the substrate including an active surface; a dummy through substrate via (TSV) extending from the back side of the substrate at least partially into the substrate, the dummy TSV electrically isolated from the active surface; a thermal interface material over the topmost integrated circuit die; and a dummy connector in the thermal interface material, the thermal interface material surrounding the dummy connector, the dummy connector electrically isolated from the active surface of the topmost integrated circuit die.

In some embodiments, the dummy connector is a solder connector disposed on the dummy TSV. In some embodiments, the dummy connector is a copper pillar disposed on the dummy TSV. In some embodiments, the device further includes: an adhesive on the topmost integrated circuit die, the dummy connector and the thermal interface material disposed on the adhesive. In some embodiments, the device further includes: dummy metallization on the topmost integrated circuit die, the dummy connector and the thermal interface material disposed on the dummy metallization, the dummy metallization electrically isolated from the active surface of the topmost integrated circuit die; and an eutectic compound on the thermal interface material, the dummy connector bonding the eutectic compound to the dummy metallization. In some embodiments, the dummy connector is a patterned metal sheet. In some embodiments, the device further includes: a package substrate, the interposer bonded to the package substrate; and a heat spreader adhered to the package substrate and the die stack, the heat spreader covering and surrounding the die stack, the thermal interface material thermally coupling the heat spreader and the die stack. In some embodiments, the die stack further includes: an interface die bonded to the interposer, the topmost integrated circuit die bonded to the interface die.

In an embodiment, a method includes: attaching a die stack to an interposer; encapsulating the die stack with an encapsulant; planarizing the encapsulant, top surfaces of the encapsulant the die stack being level; forming a recess in a topmost integrated circuit die of the die stack, the topmost integrated circuit die including a substrate having an active surface and a back surface, the substrate having a first height, the recess extending a first depth from the back surface of the substrate, the first depth less than the first height; filling the recess with a first conductive material to form a dummy through substrate via (TSV); forming a dummy connector on the dummy TSV; dispensing a thermal interface material on the topmost integrated circuit die, the thermal interface material surrounding the dummy connector; and attaching a heat spreader to the topmost integrated circuit die, the heat spreader covering and surrounding the die stack and the interposer.

In some embodiments, the method further includes: forming the interposer in a wafer; and singulating the wafer to form the interposer, the interposer having the die stack disposed thereon. In some embodiments, the dummy TSV and dummy connector are formed before the singulating the wafer. In some embodiments, the forming the dummy connector on the dummy TSV includes forming solder connectors on the dummy TSV. In some embodiments, the forming the dummy connector on the dummy TSV includes: forming a photoresist on the topmost integrated circuit die; patterning the photoresist to form an opening exposing the dummy TSV; and forming a second conductive material in the opening to form the dummy connector. In some embodiments, the method further includes: plating dummy metallization on the topmost integrated circuit die, the thermal interface material dispensed on the dummy metallization, the dummy metallization electrically isolated from the active surface of the topmost integrated circuit die. In some embodiments, the dummy connector includes a solder connector, the method further including: reflowing the solder connector to bond the dummy metallization to the heat spreader. In some embodiments, the attaching the die stack to the interposer includes: bonding the die stack to the interposer with conductive connectors; and forming an underfill between the die stack and the interposer, the underfill surrounding the conductive connectors.

In an embodiment, a method includes: attaching a die stack to an interposer; encapsulating the die stack with an encapsulant; planarizing the encapsulant, top surfaces of the encapsulant the die stack being level; dispensing a thermal interface material on the die stack; forming a dummy connector in the thermal interface material, the dummy connector surrounded by non-conductive materials on all sides; and attaching a heat spreader to the die stack, the heat spreader covering and surrounding the die stack and the interposer.

In some embodiments, the forming the dummy connector in the thermal interface material includes: forming the dummy connector on the die stack. In some embodiments, the forming the dummy connector in the thermal interface material includes: forming dummy metallization on the die stack; and forming the dummy connector on the dummy metallization. In some embodiments, the forming the dummy connector in the thermal interface material includes: disposing a patterned metal sheet in the thermal interface material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a die stack over and electrically connected to an interposer, the die stack comprising a topmost integrated circuit die comprising:
a substrate having a front side and a back side opposite the front side, the front side of the substrate comprising an active surface;
a dummy through substrate via (TSV) extending from the back side of the substrate into the substrate, the dummy TSV electrically isolated from devices at the active surface;
a thermal interface material over the topmost integrated circuit die, the thermal interface material comprising a first conductive material; and
a dummy connector in the thermal interface material, the thermal interface material surrounding the dummy connector, the dummy connector electrically isolated from the devices at the active surface of the topmost integrated circuit die, the dummy connector comprising a second conductive material, the second conductive material being different from the first conductive material.

2. The device of claim 1, wherein the dummy connector is a solder connector disposed on the dummy TSV.

3. The device of claim 1, wherein the dummy connector is a copper pillar disposed on the dummy TSV.

4. The device of claim 1, further comprising:
an adhesive on the topmost integrated circuit die, the dummy connector and the thermal interface material disposed on the adhesive.

5. The device of claim 1, further comprising:
dummy metallization on the topmost integrated circuit die, the dummy connector and the thermal interface material disposed on the dummy metallization, the dummy metallization electrically isolated from the devices at the active surface of the topmost integrated circuit die; and
an eutectic compound on the thermal interface material, the dummy connector bonding the eutectic compound to the dummy metallization.

6. The device of claim 1, wherein the dummy connector is a patterned metal sheet.

7. The device of claim 1, further comprising:
a package substrate, the interposer bonded to the package substrate; and
a heat spreader adhered to the package substrate and the die stack, the heat spreader covering and surrounding the die stack, the thermal interface material thermally coupling the heat spreader and the die stack.

8. The device of claim 1, wherein the die stack further comprises:
an interface die bonded to the interposer, the topmost integrated circuit die bonded to the interface die.

9. A device comprising:
an interposer;
a die stack connected to the interposer;

an encapsulant disposed around the die stack, a top surface of the encapsulant being planar with a top surface of the die stack;
a thermal interface material on the top surface of the encapsulant and the top surface of the die stack;
a plurality of dummy connectors in the thermal interface material, the thermal interface material laterally surrounding each of the dummy connectors, each of the dummy connectors disposed on the top surface of the die stack, each of the dummy connectors being electrically isolated from the interposer and the die stack; and
a heat spreader adhered to the thermal interface material, the heat spreader laterally surrounding the die stack and the interposer, the thermal interface material disposed between the heat spreader and each of the dummy connectors.

10. The device of claim 9, wherein the die stack comprises integrated circuit dies, the integrated circuit dies comprising:
a processor die having an active side and an inactive side; and
an interface die connected to the interposer and the active side of the processor die.

11. The device of claim 10 further comprising:
a dummy through substrate via (TSV) extending partially into the processor die from the inactive side of the processor die, the dummy TSV being electrically isolated from each of the integrated circuit dies of the die stack.

12. The device of claim 11, wherein the interface die comprises:
a functional TSV connecting the processor die to the interposer, the dummy TSV being electrically isolated from the functional TSV.

13. The device of claim 9, wherein each of the dummy connectors comprises solder.

14. The device of claim 9, wherein each of the dummy connectors comprises copper.

15. The device of claim 9 further comprising:
a dummy conductive layer between each of the dummy connectors and the die stack, the dummy conductive layer physically contacting a surface of each of the dummy connectors, the top surface of the die stack, and a surface of the thermal interface material.

16. The device of claim 9 further comprising:
a package substrate connected to the interposer, the package substrate being electrically isolated from the dummy connectors.

17. A device comprising:
a first package comprising:
a processor die having an active side and an inactive side;
an interposer connected to the active side of the processor die; and
a dummy through substrate via (TSV) extending from the inactive side of the processor die into the processor die;
a package substrate bonded to the first package;
a heat spreader attached to the package substrate and the first package;
a thermal interface material disposed between the heat spreader and the first package, the thermal interface material comprising a first metal; and
a dummy connector in the thermal interface material, the dummy connector being electrically isolated from the interposer and the processor die, the dummy connector comprising a second metal, the second metal being different from the first metal.

18. The device of claim 17, wherein the first package further comprises:
an interface die disposed between the processor die and the interposer, the interface die being face-to-face bonded to the processor die, an active side of the interface die facing the active side of the processor die.

19. The device of claim 18, wherein the first package further comprises:
a memory die bonded to the interposer adjacent the processor die, the interface die electrically interconnecting the processor die and the memory die.

20. The device of claim 17 further comprising:
a metal layer disposed between the heat spreader and the first package, the metal layer being electrically isolated from the interposer and the processor die.

* * * * *